US008475177B2

(12) United States Patent
Crofoot et al.

(10) Patent No.: US 8,475,177 B2
(45) Date of Patent: Jul. 2, 2013

(54) BACKPLANE CABLE INTERCONNECTION

(75) Inventors: Larry M. Crofoot, Perry, OH (US); John T. Venaleck, Painesville, OH (US)

(73) Assignee: Ohio Associated Enterprises, LLC, Painesville, OH (US)

( * ) Notice: Subject to any disclaimer, the term of this patent is extended or adjusted under 35 U.S.C. 154(b) by 191 days.

(21) Appl. No.: 13/008,060

(22) Filed: Jan. 18, 2011

(65) Prior Publication Data

US 2011/0177699 A1 Jul. 21, 2011

Related U.S. Application Data

(60) Provisional application No. 61/296,635, filed on Jan. 20, 2010.

(51) Int. Cl.
*H01R 12/00* (2006.01)
*H05K 1/00* (2006.01)

(52) U.S. Cl.
USPC .............................................. 439/61; 439/701

(58) Field of Classification Search
USPC .............. 439/61, 701, 607.46, 358, 569, 567, 439/712, 345
See application file for complete search history.

(56) References Cited

U.S. PATENT DOCUMENTS

| | | | | |
|---|---|---|---|---|
| 4,602,831 | A * | 7/1986 | Lockard | 439/108 |
| 4,655,518 | A | 4/1987 | Johnson et al. | |
| 4,655,578 | A | 4/1987 | Kurtz et al. | |
| 4,659,155 | A | 4/1987 | Walkup et al. | |
| 4,755,145 | A | 7/1988 | Johnson et al. | |
| 4,846,727 | A | 7/1989 | Glover et al. | |
| 4,869,677 | A | 9/1989 | Johnson et al. | |
| 4,976,628 | A | 12/1990 | Fedder | |
| 4,984,992 | A | 1/1991 | Beamenderfer et al. | |
| 5,046,960 | A * | 9/1991 | Fedder | 439/108 |
| 5,055,069 | A | 10/1991 | Townsend et al. | |
| 5,066,236 | A | 11/1991 | Broeksteeg | |
| 5,104,329 | A | 4/1992 | Brown et al. | |
| 5,104,341 | A | 4/1992 | Gilissen et al. | |
| 5,151,036 | A | 9/1992 | Fusselman et al. | |
| 5,174,770 | A | 12/1992 | Sasaki et al. | |
| 5,190,472 | A * | 3/1993 | Voltz et al. | 439/579 |
| 5,194,020 | A * | 3/1993 | Voltz | 439/579 |
| 5,238,414 | A | 8/1993 | Yaegashi et al. | |
| 5,286,212 | A | 2/1994 | Broeksteeg | |
| 5,342,211 | A | 8/1994 | Broeksteeg | |
| 5,380,216 | A * | 1/1995 | Broeksteeg et al. | 439/352 |
| 5,403,206 | A | 4/1995 | McNamara et al. | |
| 5,435,757 | A | 7/1995 | Fedder et al. | |
| 5,443,403 | A | 8/1995 | Weidler et al. | |
| 5,460,533 | A | 10/1995 | Broeksteeg et al. | |
| 5,484,310 | A | 1/1996 | McNamara et al. | |
| 5,496,183 | A | 3/1996 | Soes et al. | |
| 5,525,066 | A | 6/1996 | Morlion et al. | |

(Continued)

FOREIGN PATENT DOCUMENTS

WO 03/084003 A1 10/2003

*Primary Examiner* — Hae Moon Hyeon
(74) *Attorney, Agent, or Firm* — Renner, Otto, Boisselle & Sklar, LLP

(57) ABSTRACT

A backplane cabling interconnect scheme is provided that includes a wafer based cable termination and an organizer shroud. The shroud complements existing backplane connectors and provides positioning and polarization for the cable terminated wafer. The wafer cable ends can be stacked or arranged in various arrays and are held in place with an integral latch. A permanent latch is provided for high vibration environments.

17 Claims, 12 Drawing Sheets

U.S. PATENT DOCUMENTS

| | | | | |
|---|---|---|---|---|
| 5,620,340 | A | 4/1997 | Andrews | |
| 5,632,634 | A | 5/1997 | Soes | |
| 5,632,635 | A | 5/1997 | Vanbesein et al. | |
| 5,660,551 | A | 8/1997 | Sakurai | |
| 5,664,968 | A | 9/1997 | Mickievicz | |
| 5,702,258 | A | 12/1997 | Provencher et al. | |
| 5,775,947 | A | 7/1998 | Suzuki et al. | |
| 5,795,191 | A | 8/1998 | Preputnick et al. | |
| 5,860,816 | A | 1/1999 | Provencher et al. | |
| 5,882,214 | A | 3/1999 | Hillbish et al. | |
| 6,050,852 | A * | 4/2000 | Wu | 439/607.02 |
| 6,102,747 | A | 8/2000 | Paagman | |
| 6,146,202 | A | 11/2000 | Ramey et al. | |
| 6,190,197 | B1 * | 2/2001 | Polgar et al. | 439/527 |
| 6,270,382 | B1 | 8/2001 | Droesbeke et al. | |
| 6,371,773 | B1 | 4/2002 | Crofoot et al. | |
| 6,471,547 | B1 * | 10/2002 | Venaleck et al. | 439/607.06 |
| 6,524,135 | B1 | 2/2003 | Feldman et al. | |
| 6,780,069 | B2 | 8/2004 | Scherer et al. | |
| 6,823,587 | B2 * | 11/2004 | Reed | 29/858 |
| 6,857,899 | B2 | 2/2005 | Reed et al. | |
| 6,857,912 | B2 * | 2/2005 | Wu | 439/701 |
| 6,939,174 | B2 * | 9/2005 | Wu | 439/607.05 |
| 7,682,192 | B2 | 3/2010 | Sawdy et al. | |
| 2003/0124881 | A1 | 7/2003 | Avery et al. | |
| 2003/0186594 | A1 | 10/2003 | Davis et al. | |
| 2005/0112920 | A1 | 5/2005 | Venaleck et al. | |
| 2009/0149067 | A1 | 6/2009 | Sawdy et al. | |

* cited by examiner

BACKPLANE CABLE INTERCONNECTION

CROSS-REFERENCE TO RELATED APPLICATION

This application claims priority under 35 USC 119 to U.S. Provisional Application No. 61/296,635, filed Jan. 20, 2010, which is incorporated herein by reference in its entirety.

BACKGROUND OF THE INVENTION

1. Field of the Invention

The invention relates generally to cable interconnection at the backplane of computers.

2. Description of the Related Art

Modern electronic systems such as computer systems, telephonic switches and the like, often include large circuit boards called backplane boards that are rack mounted or retained in cabinets and are electrically connected to a number of smaller circuit boards called daughter cards. Various functions on the daughter cards are transferred between cards via the backplane. Examples of such configurations may be found in U.S. Pat. Nos. 6,824,391, 6,267,604, and 6,171,115.

FIGS. 1 and 2 show an example of a connection scheme 1 that allows multiple daughter cards to be connected to a common backplane or motherboard 3. Interconnections from one daughter card to another run through this backplane 3. Connectors 6 may be used to make the interconnections. Additionally, the backplane 3 can be configured with the same connector 6 on the side opposite the daughter cards to allow a unit called the rear transition module to be added. Often during development, there is a need to either probe certain connection points on the backplane or to change the routing of the circuitry, and rear transition modules may be used to make such connections. Rear transition modules may be a circuit board with a first connector that mates with the connector 6, a second connector for connecting to other devices, and conductive traces on the rear transition module circuit board for making connections between its first connector and second connector. Optional connectivity may be added to the rear transition module to allow cable input-output I/O and the like. Such modules are expensive, allow limited flexibility, and take up considerable space behind the backplane 3.

It will be appreciated that improvements in making connections to backplanes would be desirable.

SUMMARY OF THE INVENTION

According to an aspect of the invention, a low electrical loss interconnection is provided at a backplane.

According to another aspect of the invention, an interconnection provides ability to enhance the existing backplane capability by allowing additional circuitry external of the backplane.

According to yet another aspect of the invention, custom configuration capability is added by point-to-point ordering.

According to still another aspect of the invention, an interconnection allows easy changes to the backplane circuitry in the laboratory during product development.

According to a further aspect of the invention, an interconnection provides a low profile, allowing close panel enclosure.

According to a still further aspect of the invention, an interconnection reduces the backplane complexity, allowing for lower backplane cost.

According to another aspect of the invention, an interconnection enables cabling to the front panel of the enclosure as well as the backpanel or external direct.

According to yet another aspect of the invention, an interconnection provides the ability to attach a high bandwidth probe to the backplane circuitry.

According to still another aspect of the invention, an interconnection provides point-to-point interconnect capability.

According to a further aspect of the invention, an interconnection enhances existing backplane capabilities.

According to a still further aspect of the invention, an interconnection provides low attenuation in point-to-point connection.

According to other aspects, permanent holddowns are provided for deployment in vibration environs, a low profile allows close panel enclosure, an interconnection could reduce complexity of backplane thus lowering cost, and an interconnection allows cabling to front panel as well as backpanel or I.O. direct.

According to other aspects, an interconnection includes one or more cable wafer captures (holddowns) that have one or more of a radius limit, a retention function, retention by screws, and the ability to disable a latching function.

According to yet other aspects, an interconnection includes a shroud that has one or more of polarization left and right, polarization of power, and elevation to allow circuit board use up to (adjacent to) a backplane connector.

According to still other aspects, a wafer of an interconnection includes one or more of a snap feature for coupling together multiple wafers, cable egress and strain relief, stacking of latch arms of stacked wafers, polarization features, a latch feature for engaging a shroud, such as apertures in the shroud, a stress limiter, and an alignment feature using pins or posts.

According to another aspect of the invention, a backplane cable interconnection includes: a shroud for surrounding contacts of a backplane; cable end modules installed in slots of the shroud, wherein each of the cable end modules includes: a printed circuit board having contact pads for engaging the contacts of the backplane; one or more cables having conductors that are coupled to the contact pads; and an overmold on the printed circuit board that mechanically couples the one or more cables to the printed circuit board; and holddowns that are mechanically coupled to the shroud to retain the cable end modules in the slots. The holddowns disable a release feature of the cable end modules that would allow release of the cable end modules from the slot.

According to yet another aspect of the invention, a cable end module including: a printed circuit board having contact pads; one or more cables having conductors that are coupled to the contact pads; and an overmold on the printed circuit board that mechanically couples the one or more cables to the printed circuit board. The overmold includes a protrusion and a protrusion-receiving recess on opposite sides. The protrusion snaps into the protrusion-receiving recess of an adjacent of an adjacent cable end module.

According to still another aspect of the invention, a shroud for surrounding contacts of a backplane, the shroud including: a main body having slots therein for receiving stacked cable end modules; and a pair of side brackets at opposite ends of the main body. The main bodies has pairs of latch windows corresponding to respective of the slots, for receiving protrusions of the cable end modules when the modules are inserted into the slots. The side brackets keep the main body away from the backplane when the shroud is installed on the backplane.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The annexed drawings, which are not necessarily to scale, show various aspects of the invention.

DETAILED DESCRIPTION

A backplane cable interconnection is used to engage a backplane connector on a backplane. The backplane cable interconnection includes a shroud that that fits around the backplane connector, and a series of cable end modules that are inserted into the shroud. The shroud and the modules are used in place of rear transition modules. Such rear transition modules are fundamentally very expensive because of size and complexity; and, therefore, are not easily replaced with new designs. Also, backplane circuitry, such as that in rear transition modules, has electrical losses that are greater than cable losses. The present interconnection satisfies a need that exists for a connection method that will allow backplane circuit rerouting with small electrical losses, while allowing the ability to be easily changed without large investment. Also, a need exists for a backplane interconnection that will allow direct cabling between the backplane and the enclosure or between the backplane and an adjacent enclosure. Additionally, a need exists for a backplane interconnection that allows discrete probing of backplane circuitry by providing access at the backplane position. All of these advantages are provided by the interconnection described below.

The present cable interconnection allows ultimate flexibility when either cabling daughter-card position to daughter-card position, point-to-point, or when incorporating cable I/O from the backplane. This utility recognized the need for laboratory development experimentation and for ultimately deployable product having certain unique functions.

For example, it has long been recognized that circuit board attenuation exceeds cable attenuation by a large margin-sometimes 10:1. Certain critical electrical paths would benefit from cable interconnection. Also, products can be easily reconfigured by cabling rather than redoing an expensive backplane circuit board. Additionally, cables can go from the backplane to the enclosure panel, either front or back, and then to the outside world. Alternatively cables can go directly from the backplane to the outside world. Obviously, these improvements are of substantial value.

Figure 1:
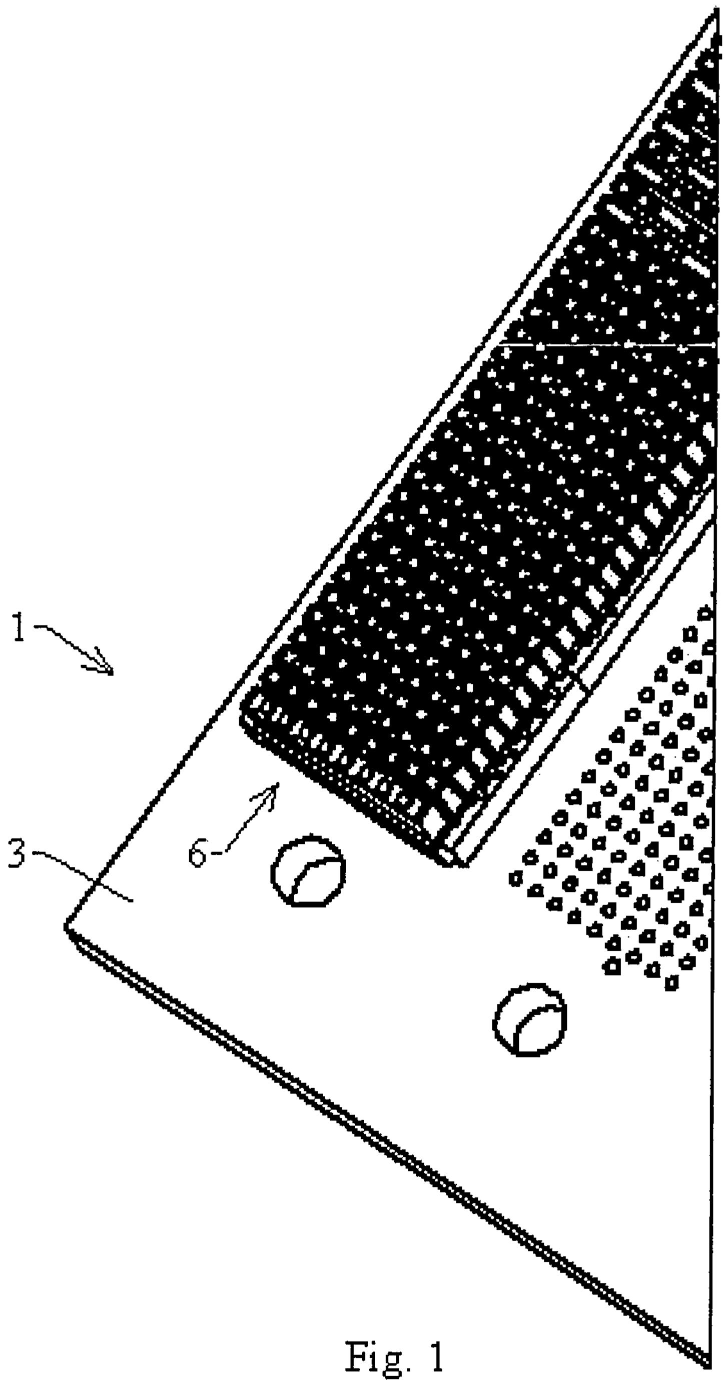
Fig. 1 Prior Art
FIG. 1 is an oblique view of part of a backplane.
Figure 2:
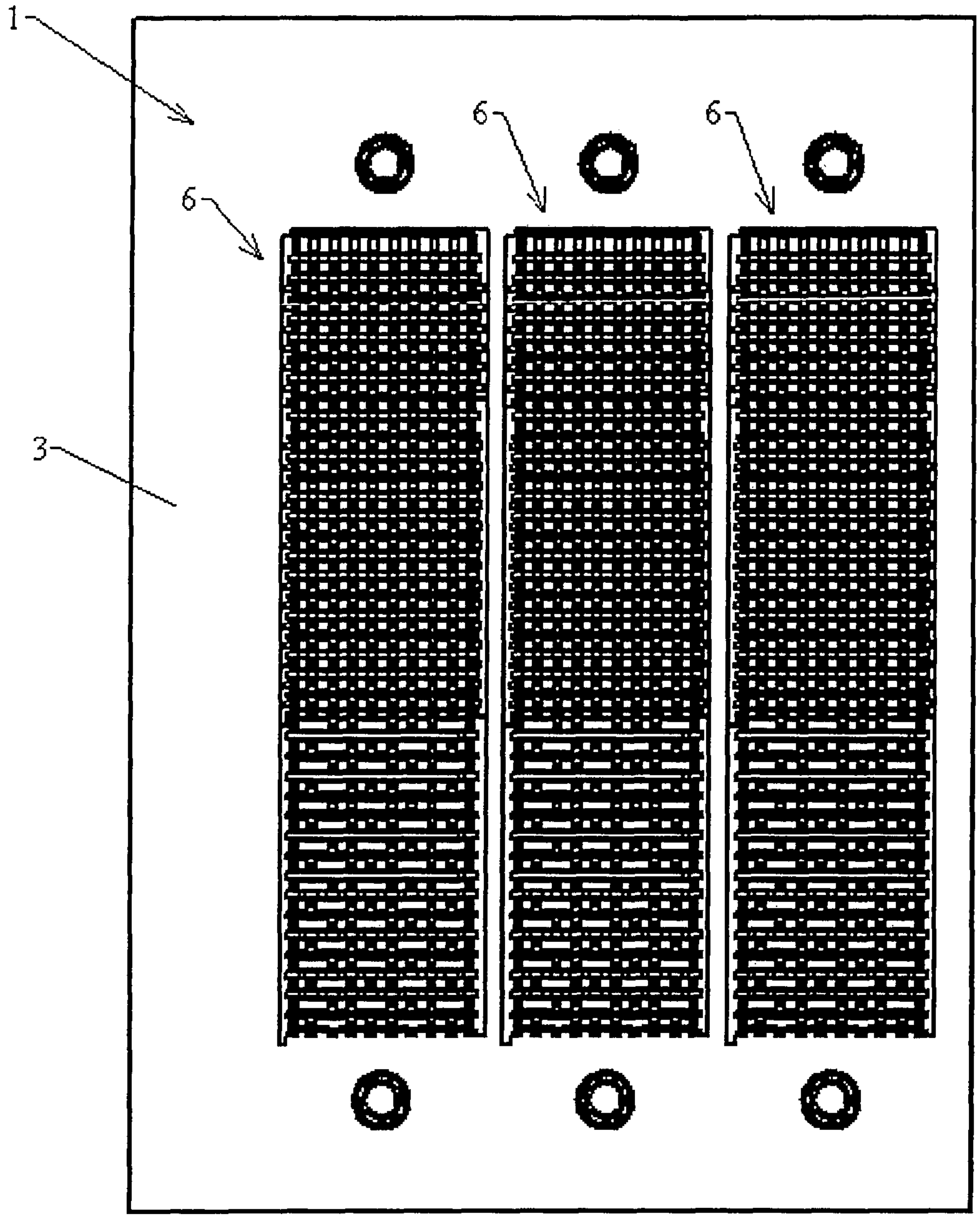
Fig. 2 Prior Art
FIG. 2 is a plan view of the backplane.
Figure 3:
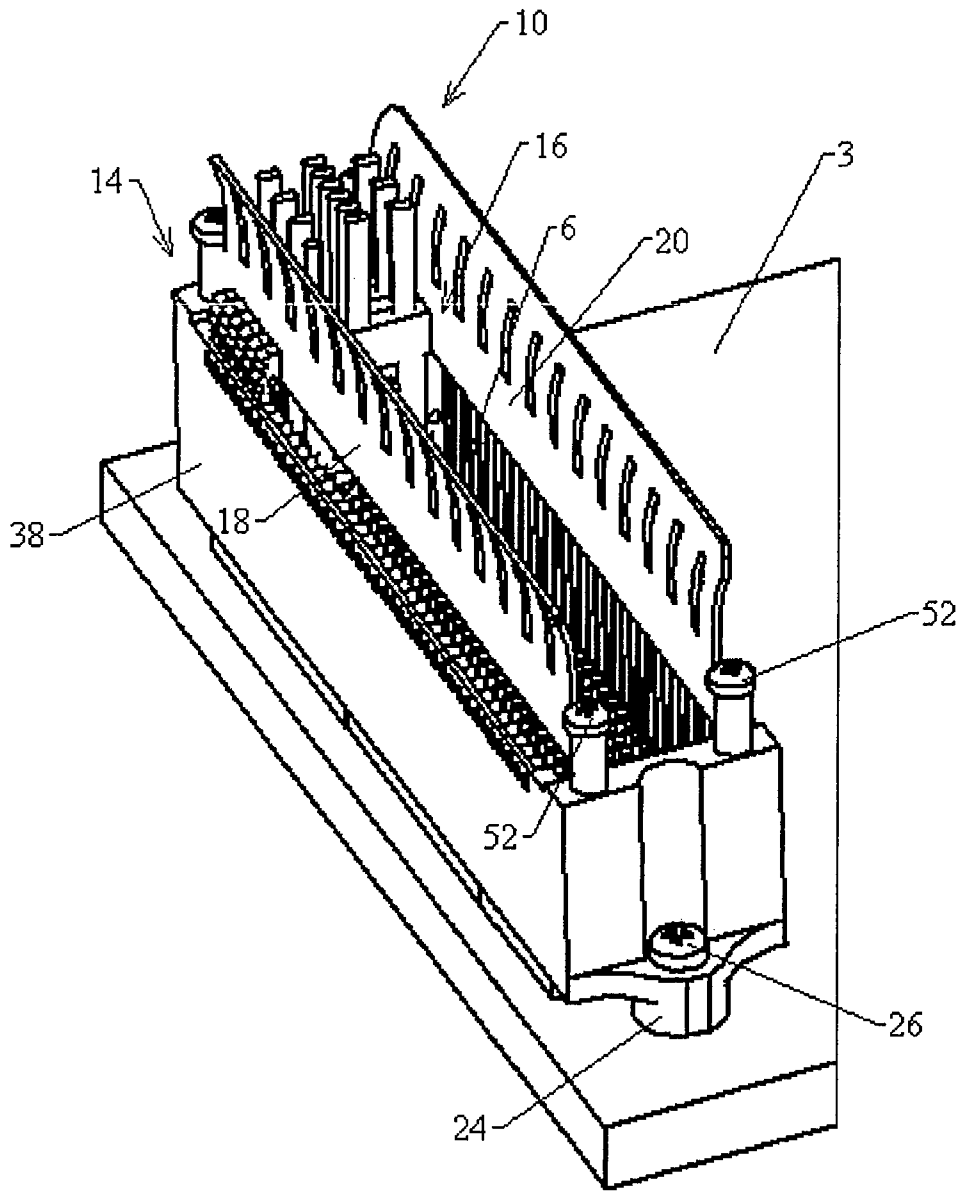
FIG. 3 is an oblique view of an interconnection in accordance with an embodiment of the present invention, installed on a backplane.

Referring now to FIG. 3, an interconnection 10 is shown mounted to the backplane 3 that has the connector 6 on it. The interconnection 10 includes a shroud or shell 14 that fits around the connector 6, cable end modules (cable wafers or wafers) 16 that are installed in the shroud 14 and engage electrical contacts of the connector 6, and cable wafer capture brackets (holddowns) 18 and 20 that are used to retain the cable end modules 16 in the shroud 14.

Figure 4:
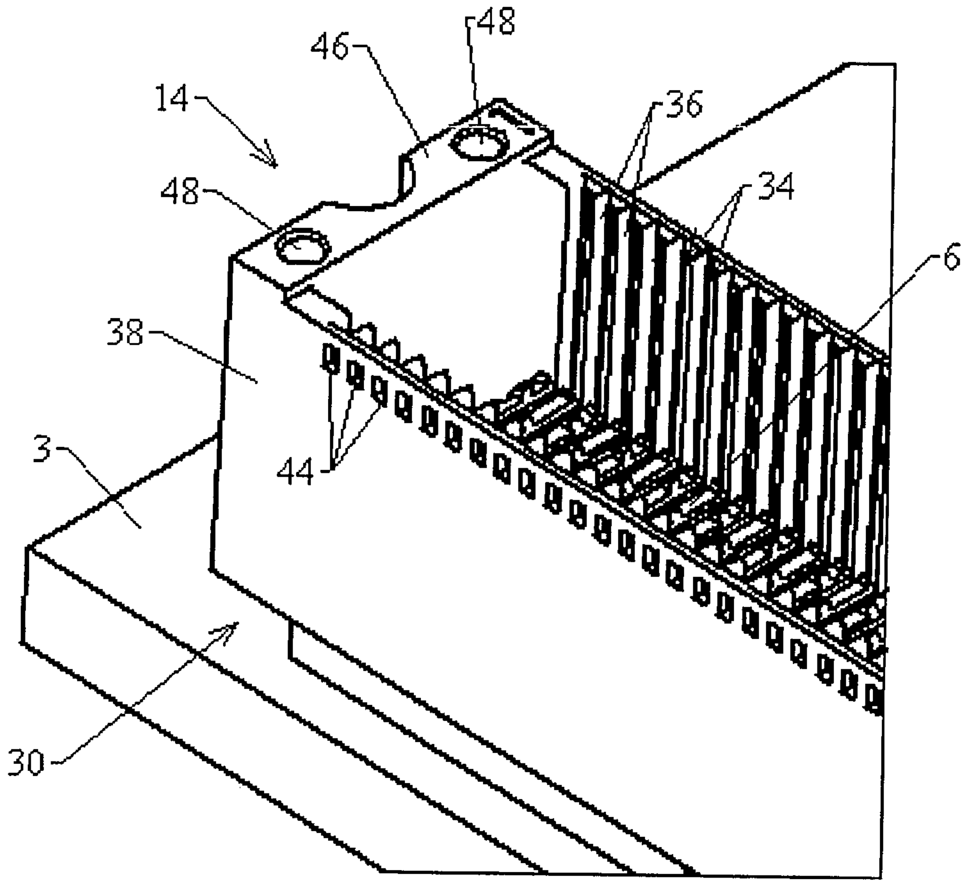
FIG. 4 is an oblique view of part of the shroud of the interconnection of FIG. 3.

With reference now in addition to FIG. 4, the shroud 14 is a die cast metal part that is used to hold secure the interconnection 10 to the backplane 3, and to allow the wafers 16 and the brackets 18 and 20 to be secured to it. Alternatively the shroud 14 may be a plastic part, such as a molded plastic part. The shroud 14 has a pair of side brackets at either end, such as the bracket 24, for receiving screws, such as the screw 26, for securing the shroud 14 to the backplane 3. The brackets 24 keep a main body 30 of the shroud 14 off of the surface of the backplane 3. The main body 30 may be about 0.125" above the backplane 3. Having the main body 30 spaced above the backplane 3 prevents interference with components that might be located on the backplane 3 close to the connector 6. The underside of the brackets 24 have protruding bosses around the bracket screw holes. The bosses are configured to engage holes in the backplane 3, to aid in properly locating the shroud 14 relative to the backplane holes.

The shroud main body 30 has a series of vertical slots 34 separated by partitions 36 extending into the interior space of the main body 30 from side walls 38 of the main body 30. Each of the slots 34 is configured to receive one of the wafers 16, for engagement with the contacts of the connector 6 at the bottom of the slot 34. The separate slots 34 aid in keeping the wafers 16 properly spaced and positioned, even when several wafers 16 are stacked together and inserted as a unit.

The side walls 38 of the shroud body 30 have latch windows 44, a series of rectangular (square) holes in the side walls for receiving a latching mechanism of the waters 16, as described further below. Each of the slots 34 has one of the latch windows on each side, for securing the wafer 16 placed in that slot 34.

Corners of a top wall 46 of the body 30 have tapped holes 48 therein. The tapped holes 48 are for receiving screws 52 that secure the brackets 18 and 20 to the shroud 14.

Figure 5:
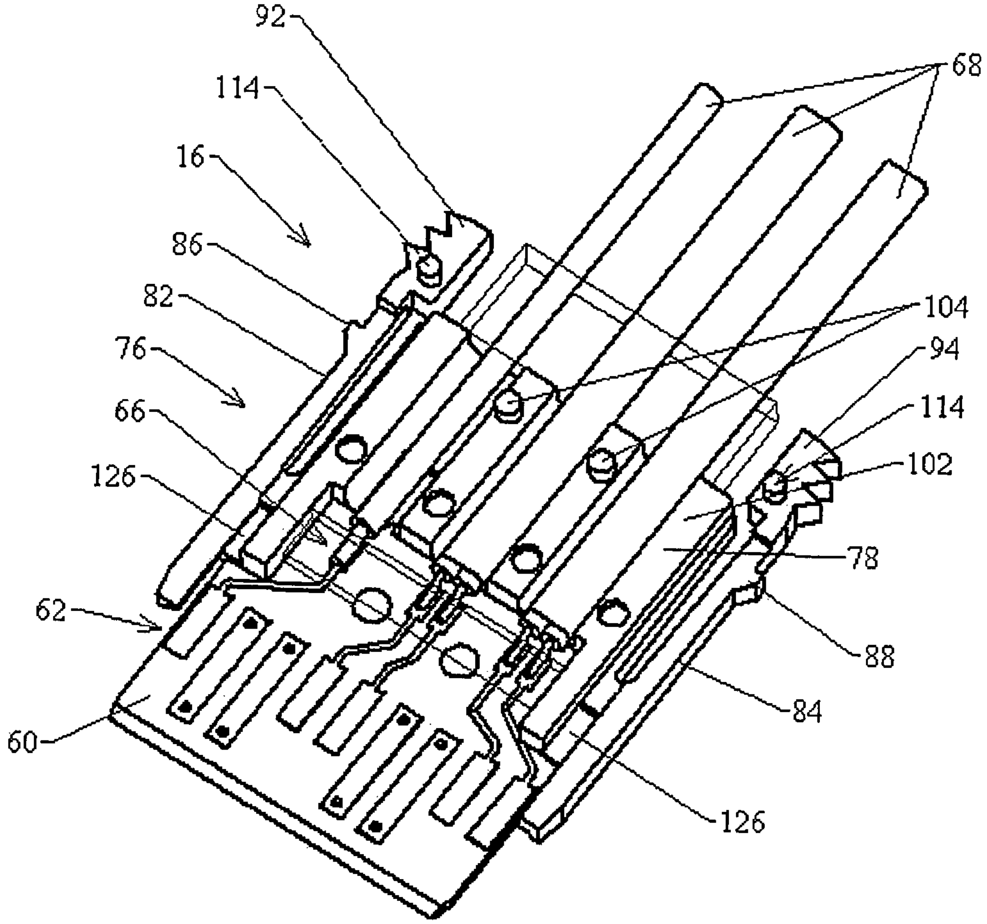
FIG. 5 is a top view of a cable end module of the interconnection of FIG. 3.
Figure 6:
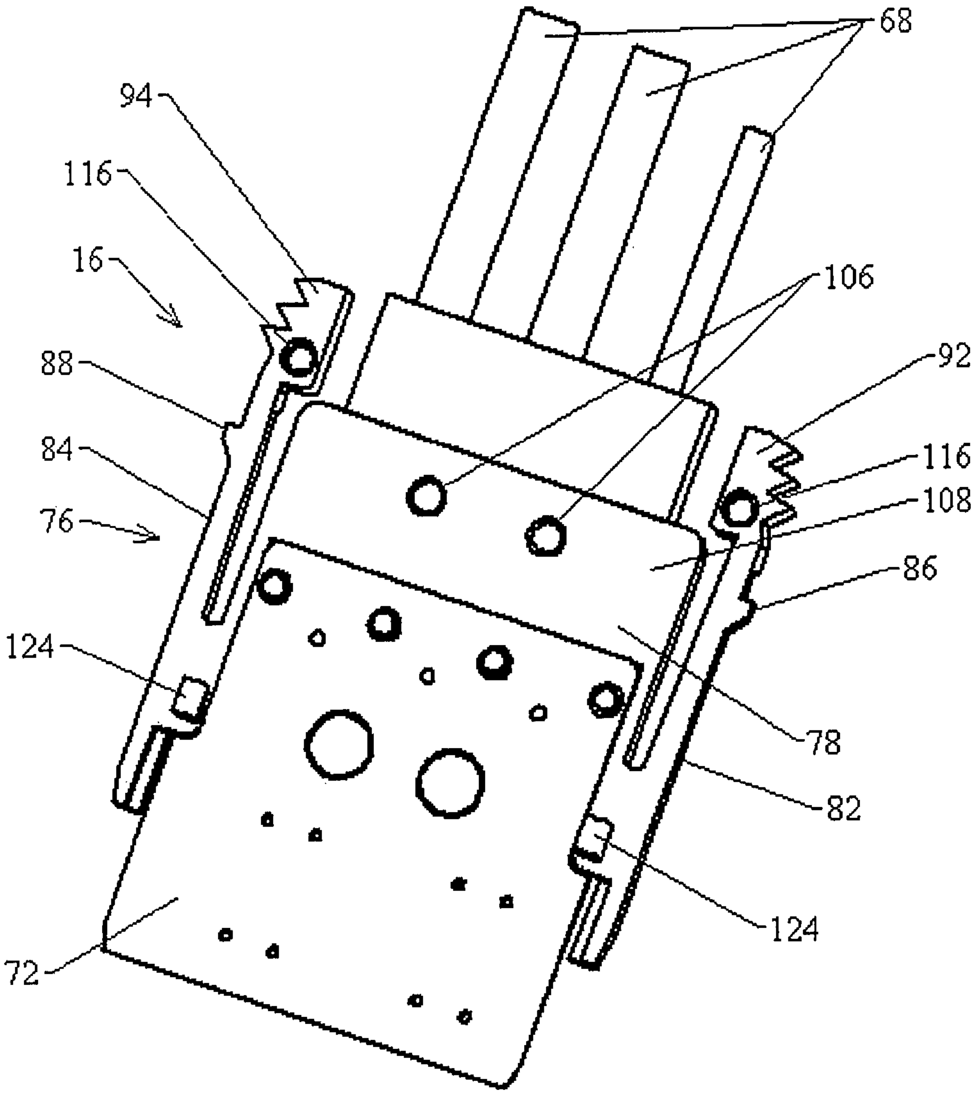
FIG. 6 is a back view of the cable end module of FIG. 5.
Figure 7:
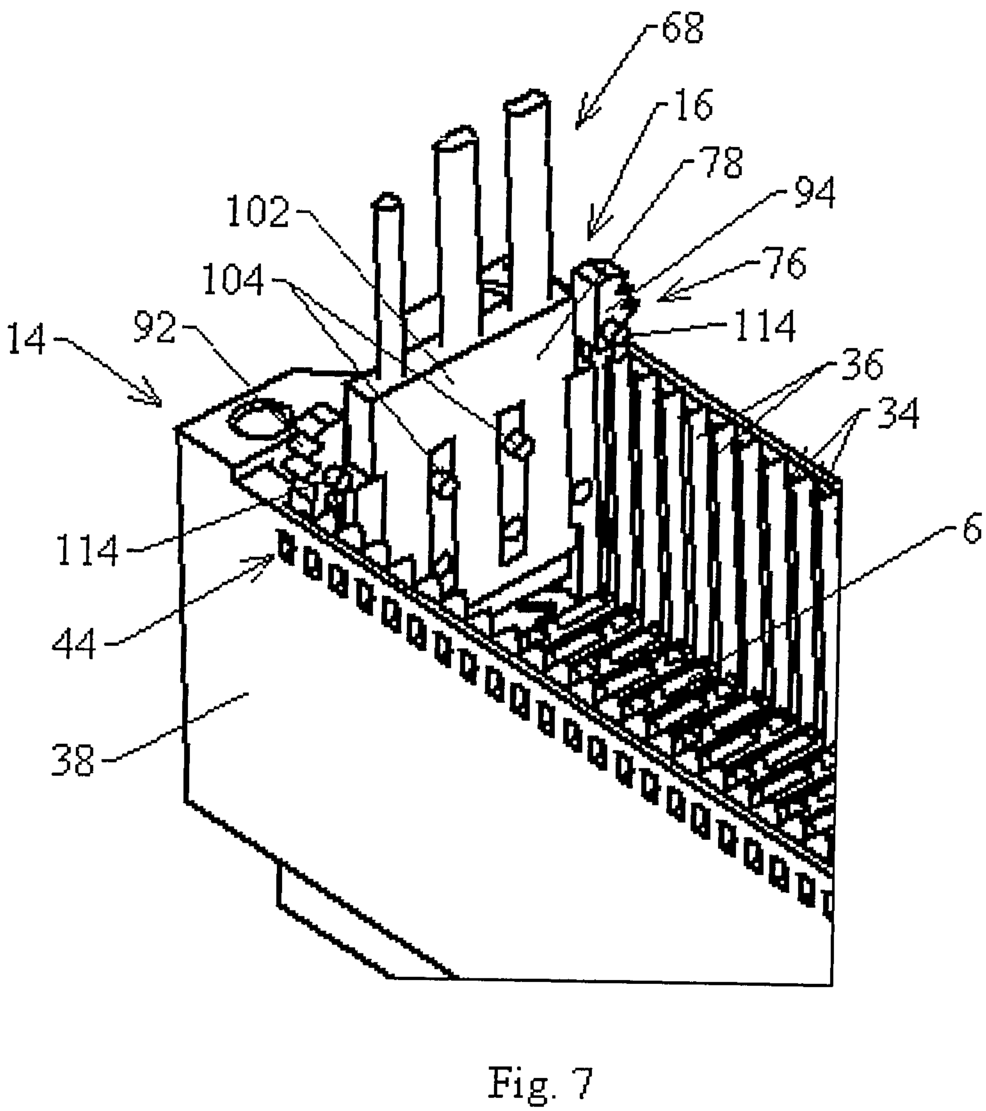
FIG. 7 is an oblique view of part of the interconnection of FIG. 3, highlighting further details.

FIGS. 5-7 show further details of the wafer 16 and its securement to the shroud 14. The wafer 16 has a printed circuit board 60 that has a series of the conductive contact pads 62 for engaging the contacts of the backplane connector 6 (FIG. 3). Conductors 66 of cables 68 are soldered or otherwise electrically connected to conductive traces in contact with some of the contact pads 62. In the illustrated embodiment two of the cables are twin coaxial cables, while a third is a single coaxial, but it will be appreciated that a variety of cable configurations are possible. After the cables 68 are coupled to the circuit board 60 a polymer overmold covers the ends of the cables 68 and the connections of the conductors 66 to the circuit board 60. The overmold provides a good strain relief for the ends of the cables 68.

Other pads 62 are coupled to a conductive shield plane or ground plane 72 that is on a back side of the circuit board 60. The ground plane 72 is a conductive material that is placed on the back side of the circuit board, in a manner similar to the placement of the contact pads 62 and conductive traces on the front side of the circuit board 60. Electrical contact between the ground plane 72 and some of the contact pads 62 is made through vias in the circuit board 60 that are filled with conductive material.

A molded plastic piece or body 76 is heat staked onto the circuit board 60. The plastic piece 76 includes a central body portion 78, and a pair of arms 82 and 84. The plastic piece or body 76 may be made of any of a variety of suitable plastics, for example suitable thermoplastics. In addition the arms 82 and 84 provide features to secure the wafer 16 to the shroud 14. Further, there are locating features on both the central body portion 78 and the arms 82 and 84 to aid in stacking multiple of the wafers 16 together, and to move the arms 82 and 84 of a stack of wafers 16 together.

The arms 82 and 84 are able to flex relative to the central body portion 78. The arms 82 and 84 have respective latch protrusions 86 and 88 for engaging the latch windows 44 of the shroud 14. The latch protrusions 86 and 88 have ramped bottom surfaces so that the arms 82 and 84 flex inward on their own as the wafer 16 is inserted into the shroud 14. The latch protrusions 86 and 88 have squared-off upper surfaces such that once the latch protrusions 86 and 88 are engaged with the latch windows 44 they remain so engaged unless the arms 82 and 84 are pressed inward to disengage. This may be done by pressing inward on upper (distal) arm portions 92 and 94. The upper arm portions 92 and 94 extend above the shroud side walls 38 when the wafer 16 is installed in the shroud 14.

The arms 82 and 84 are thinner than the central body portion 78. This is to allow for the thickness of the shroud partitions 36, which are between the arms 82 and 84 of adjacent of the wafers 16, but are not between bodies 78 of adjacent of the wafers 16. The arms 82 and 84 may have about half the thickness of the body portion 78.

Figure 8:
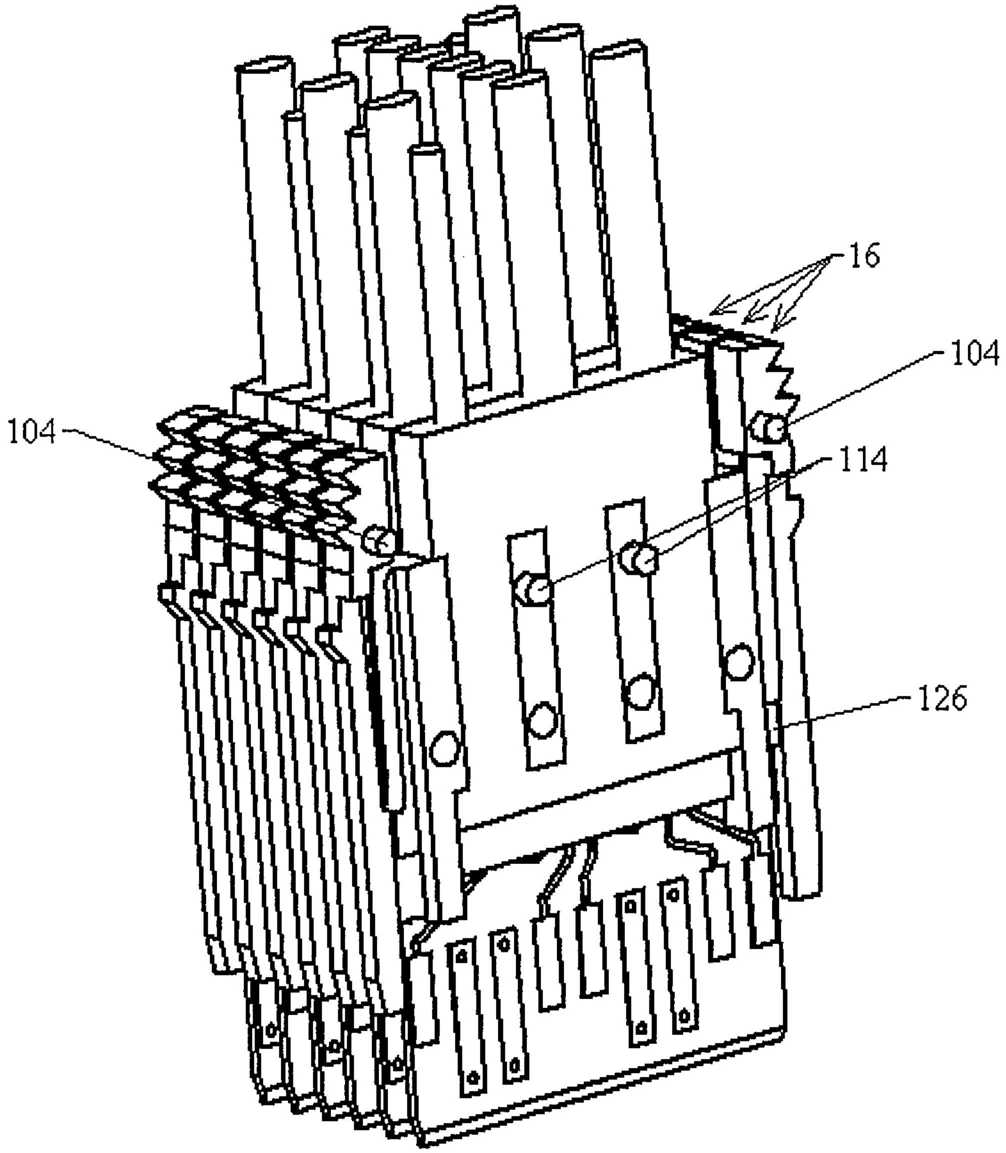
FIG. 8 shows a stack of cable end modules used as part of the interconnection of FIG. 3.

A top surface 102 of the plastic piece or body 76 has a pair of body protrusions (pins) 104 that line up with and fit into corresponding body recesses 106 on a bottom surface 108 of the plastic piece or body 76. The fitting of the body pins 104 into the body recesses 106 of an adjacent wafer 16 aids in aligning the adjacent wafers 16 as the wafers 16 are stacked, as shown in FIG. 8.

Figure 9:
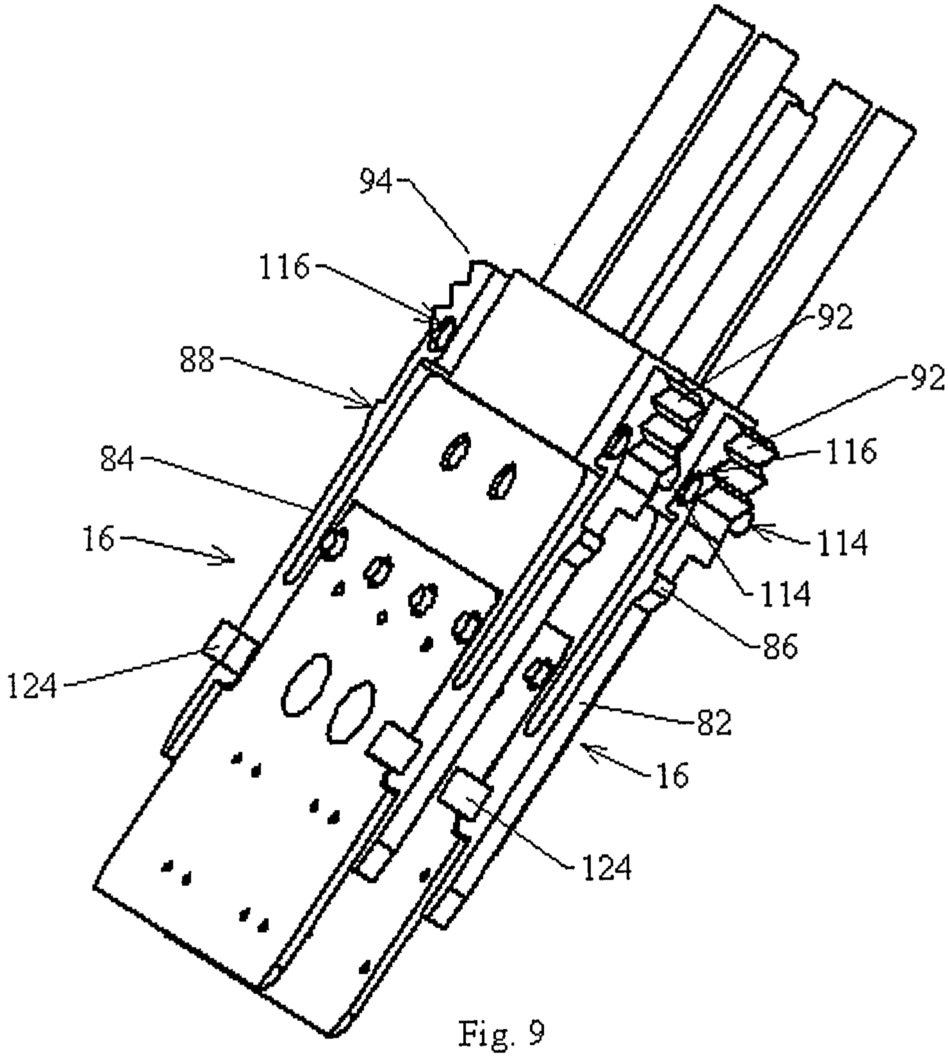
FIG. 9 is an exploded view showing a pair of the modules of the stack of FIG. 8.

The top surface 102 also has protrusions (pins) 114 on the upper arm portions 92 and 94, with corresponding recesses 116 on the bottom surface 108, located at corresponding locations on the upper arm portions 92 and 94. With reference to FIG. 9, the upper arm pins 114 and upper arm recesses 116 are used to mechanically couple together the overlapping upper arm portions 92 and 94 of stacked wafers 16. This allows a user to move all of the upper portions 92 and 94 of a group of stacked wafers 16, even by pushing inward on the upper arm portions 92 and 94 of only some (or even one) of the wafers 16.

Figure 10:
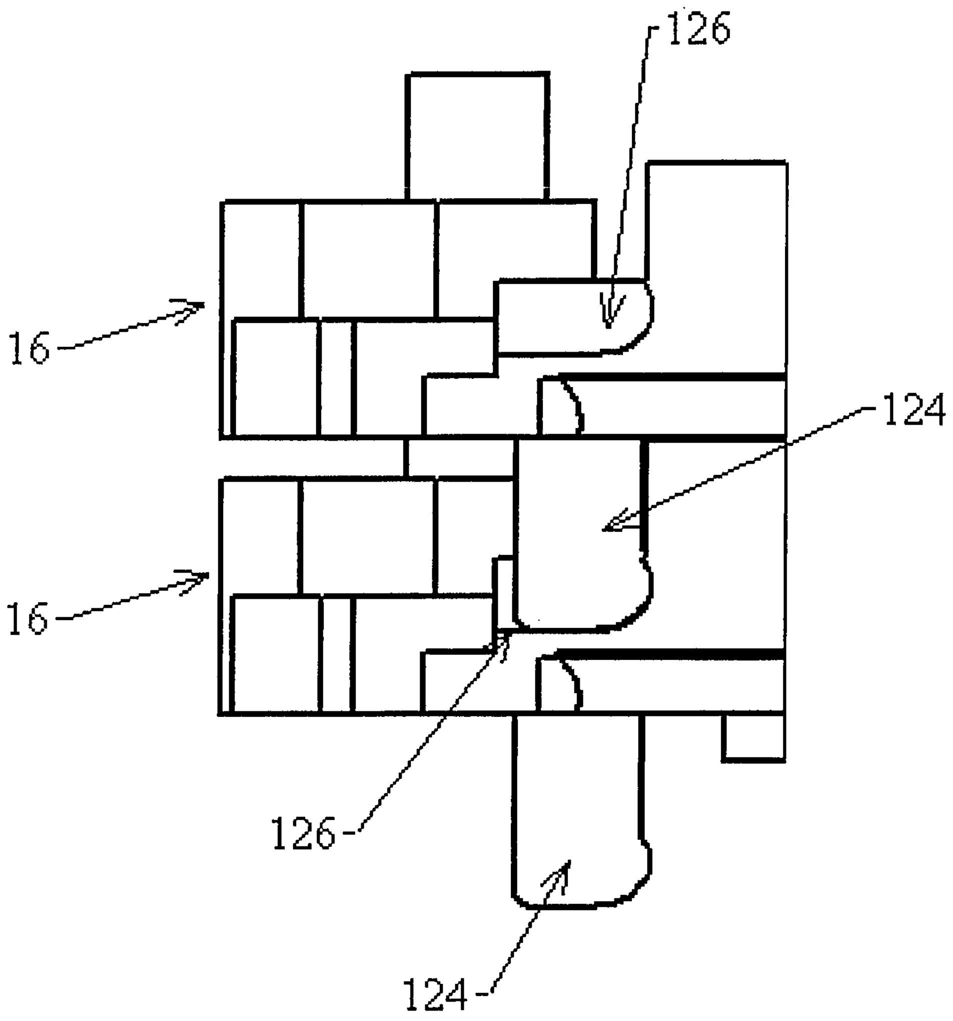
FIG. 10 is a side view of the connection between two of the modules of the stack of FIG. 8.

Considering now in addition FIG. 10, the plastic piece or body 76 also has a snap lock feature for assembling a stack of the wafers 16. The bottom surface 108 has protrusions 124 that snap into and lock in corresponding recesses 126 in the plastic piece or body bottom surface 102.

The wafers 16 can be inserted into the shroud 14 either individually or stacked in groups. Groups of the wafers 16 may be snapped together and inserted as a unit.

With the explanation of the features of the shroud 14 and the wafer 16 now complete, FIG. 3 is referred to again to explain the function of the cable wafer capture brackets (holddowns) 18 and 20. The holddowns 18 and 20 are coupled to the shroud 14 by use of the screws 52 that engage the holes 48 in the shroud 14. Between the anchors at their ends, the holddowns 18 and 20 are strips of metal that run along both sides of the central body portion 78 of the wafers 16. This places the holddowns 18 and 20 between the central body portion 78 and the arms 82 and 84 of the wafer 16. When the holddowns 18 and 20 are in place the arms 82 and 84 cannot be pressed inward to have their latching protrusions 86 and 88 disengage the shroud latch windows 44. This prevents unwanted disengagement of the wafers 16, such as in a high-vibration environment. The holddowns 18 and 20 may have flared upper ends, curved (radiused) away from the center of the shroud 14.

Figure 11:
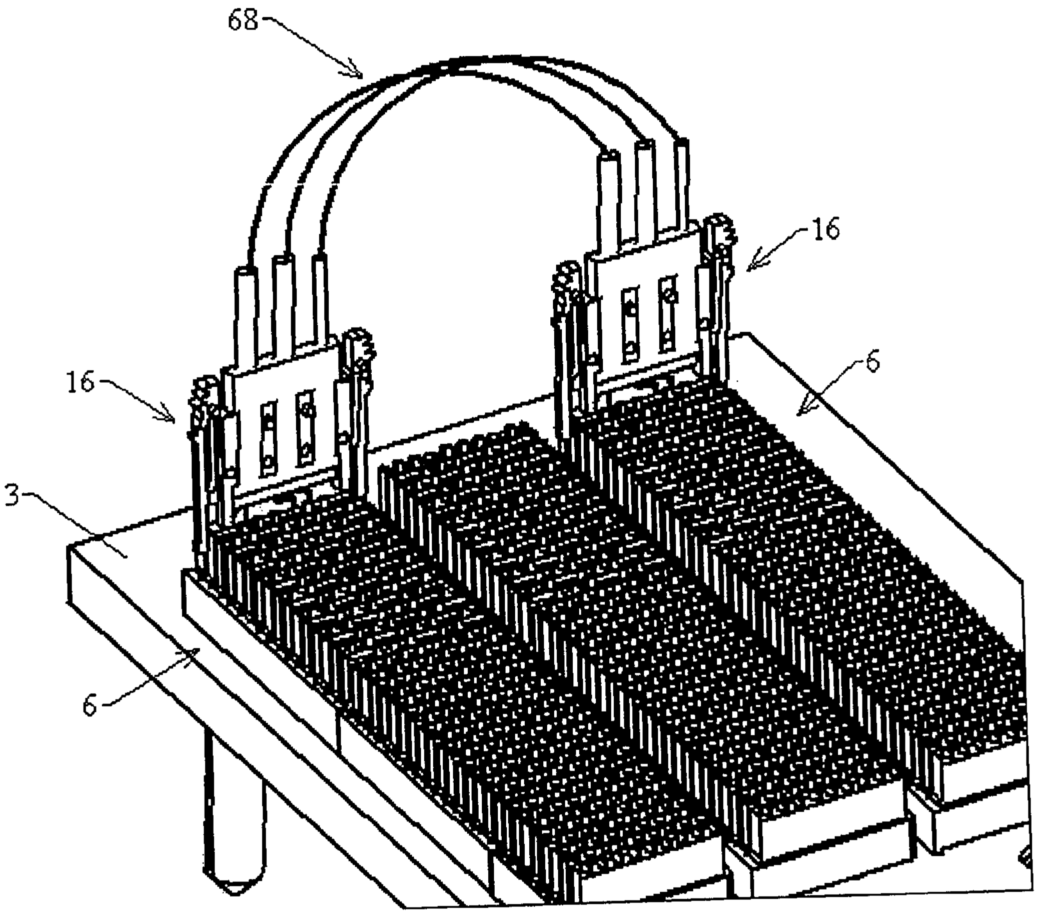
FIG. 11 is an oblique view showing connection of contacts of connectors on a backplane.

FIG. 11 shows one application of the system described herein, with wafers 16 at either end of cables 68 used to provide point-to-point interconnection between contacts of one or more of the connectors 6 on the backplane 3.

Figure 12:
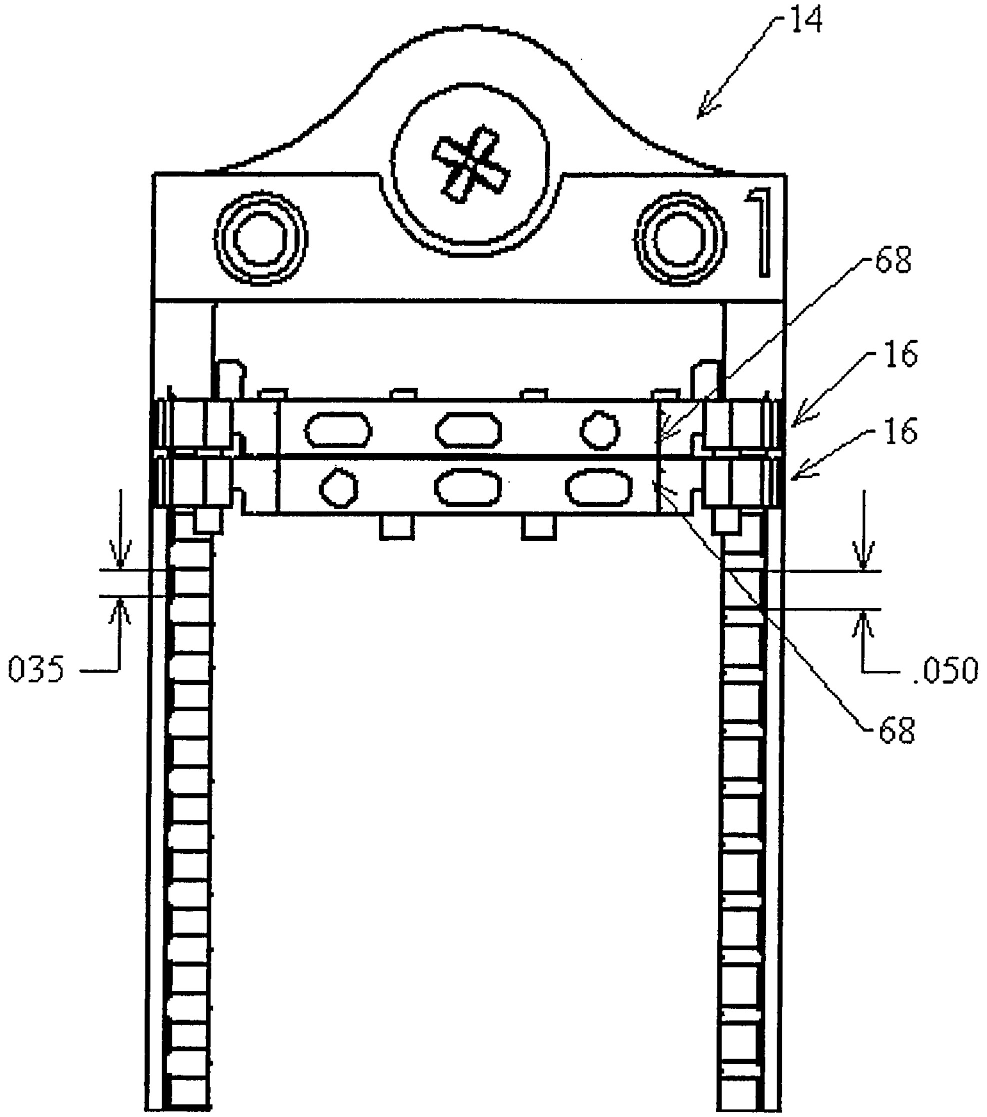
FIG. 12 is a plan view of an interconnection according to an alternate embodiment of the present invention.

FIG. 12 illustrates additional features, with adjacent wafers 16 have an alternating arrangement of cables 68. In addition FIG. 12 shows a polarization feature of the shroud 14, with one side of the slots 34 having a different thickness than the other side (0.05" versus 0.035" in the illustrated embodiment). This resulting in a polarized shell 14, with the different width slot sides prevent insertion of the wafers 16 the wrong way.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A backplane cable interconnection comprising:

a shroud for surrounding contacts of a backplane;

cable end modules installed in slots of the shroud, wherein each of the cable end modules includes:

a printed circuit board having contact pads for engaging the contacts of the backplane;

one or more cables having conductors that are coupled to the contact pads; and an overmold on the printed circuit board that mechanically couples the one or more cables to the printed circuit board; and holddowns that are mechanically coupled to the shroud to retain the cable end modules in the slots;

wherein the holddowns disable a release feature of the cable end modules that would allow release of the cable end modules from the slot; and wherein the release feature includes, for each of the cable end modules, a central body, and a pair of arms emanating from the central body.

2. The interconnection of claim 1, wherein the holddowns are coupled to the shroud by screws that engaged tapped holes in the shroud.

3. The interconnection of claim 1,
wherein the arms are able to flex relative to the central body; and
wherein the arms include latch protrusions that engage latch windows in the shroud when the cable end modules are installed in the slots.

4. The interconnection of claim 3, wherein the holddowns are located between the central bodies of the cable end modules, and the arms of the cable end modules, preventing inward flexing of the arms toward the central body, thereby preventing disengagement of the latch protrusions from the latch windows.

5. The interconnection of claim 4, wherein the holddowns are metal strips that are curved away from a center of the shroud.

6. The interconnection of claim 3, wherein the central bodies each include a body protrusion on one side that fits into a corresponding recess on an adjacent of the cable end modules.

7. The interconnection of claim 3, wherein the arms each include an arm protrusion on one side that engages a corresponding arm recess on an adjacent of the cable end modules.

8. The interconnection of claim 1,
wherein the overmold includes a protrusion and a protrusion-receiving recess on opposite sides; and
wherein the protrusion of one of the cable end modules snaps into the protrusion-receiving recess of an adjacent of the cable end modules.

9. The interconnection of claim 1,
wherein the shroud includes:
a main body having the slots therein; and
a pair of side brackets at opposite ends of the main body; and
wherein the side brackets keep the main body away from the backplane when the interconnection is installed on the backplane.

10. The interconnection of claim 1,
wherein the slots have different thickness on one slot side than on an opposite slot side; and
wherein the overmolds have corresponding different thicknesses on opposite overmold sides where the overmolds are inserted into different thickness slot sides.

11. The interconnection of claim 1, wherein the printed circuit board has a conductive ground plane on an opposite face from the contacts.

12. The interconnection of claim 11, wherein the ground plane is in electrical contact with one or more of the contact pads through one or more vias in the printed circuit board that are filled with conductive material.

13. A cable end module comprising:
a printed circuit board having contact pads;
one or more cables having conductors that are coupled to the contact pads; and
an overmold on the printed circuit board that mechanically couples the one or more cables to the printed circuit board;
wherein the overmold includes a protrusion and a protrusion-receiving recess on opposite sides;
wherein the protrusion snaps into the protrusion-receiving recess of an adjacent of an adjacent cable end module;
wherein for each of the cable end modules, the overmold includes a central body and a pair of arms emanating from opposite sides of the central body, wherein the arms are able to flex relative to the central body; and
wherein the arms include latch protrusions for engaging latch windows in a shroud.

14. The cable end module of claim 13 as part of a plurality of cable end modules snapped together.

15. The cable end module of claim 13, wherein the central bodies each include a body protrusion on one side that fits into a corresponding recess on an adjacent of the cable end modules.

16. The cable end module of claim 13, wherein the arms each include an arm protrusion on one side that engages a corresponding arm recess on an adjacent of the cable end modules.

17. The cable end module of claim 13,
wherein the printed circuit board has a conductive ground plane on an opposite face from the contacts; and
wherein the ground plane is in electrical contact with one or more of the contact pads through one or more vias in the printed circuit board that are filled with conductive material.

* * * * *